US010249927B2

(12) United States Patent
Chieh

(10) Patent No.: US 10,249,927 B2
(45) Date of Patent: Apr. 2, 2019

(54) COCHLEA-BASED MICROWAVE CHANNELIZER

(71) Applicant: THE UNITED STATES OF AMERICA AS REPRESENTED BY THE SECRETARY OF THE NAVY, Washington, DC (US)

(72) Inventor: Jia-Chi S. Chieh, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 29 days.

(21) Appl. No.: 15/486,106

(22) Filed: Apr. 12, 2017

(65) Prior Publication Data

US 2018/0301779 A1 Oct. 18, 2018

(51) Int. Cl.
*H01P 5/12* (2006.01)
*H03H 7/01* (2006.01)
*H01P 1/203* (2006.01)

(52) U.S. Cl.
CPC ............ *H01P 5/12* (2013.01); *H01P 1/20363* (2013.01)

(58) Field of Classification Search
CPC .. H01P 1/20; H01P 3/026; H01P 3/081; H01P 1/208; H01P 1/2138; H03H 2007/013
See application file for complete search history.

(56) References Cited

U.S. PATENT DOCUMENTS 5,838,675 A 11/1998 Rauscher
2007/0290768 A1* 12/2007 Rauscher ................ H01P 1/208 333/135

OTHER PUBLICATIONS

R. Cameron., M. Yu, "Design of manifold-coupled multiplexers," IEEE Microwave Magazine, vol. 8, No. 5, pp. 46-59, Oct. 2007.
C. J. Galbraith, R. D. White, L. Cheng, K. Grosh, and G. M. Rebeiz, "Cochlea-based RF channelizing filters," IEEE Trans. Circuit Syst., vol. 55, No. 4, pp. 969-979, May 2008.
C.J. Galbraith, G.M. Rebeiz, "Higher Order Cochlea-Like Channelizing Filters," IEEE Trans. Microwave Theory Tech., vol. 56, No. 7, pp. 1675-1683, Jul. 2008.
C. Galbraith, G.M. Rebeiz, R. Drangmeister, "A Cochlea-based Preselector for UWB Applications," in IEEE Radio Frequency Integrated Circuits (RFIC) Symp. Dig., 2007, pp. 219-222, Jun. 3-5, 2007.

(Continued)

*Primary Examiner* — Robert J Pascal
*Assistant Examiner* — Kimberly E Glenn
(74) *Attorney, Agent, or Firm* — SPAWAR Systems Center Pacific; Kyle Eppele; Ryan J. Friedl

(57) ABSTRACT

A system includes an RF input coupled to a plurality of channel filters through an inductive manifold. Each of the channel filters is configured as a series resonator and has a frequency of greater than about 1 GHz. The frequency of the channel filters decreases as their distance from the RF input increases. Components of each of the channel filters, which may include a series inductor, series capacitor, and shunt capacitor, are configured using high-Q transmission lines. A tunable notch filter, such as an absorptive tunable band-stop filter, may be included within the channel filters. The system may be used for protection of wideband receivers.

20 Claims, 22 Drawing Sheets

(56) References Cited

OTHER PUBLICATIONS

J. P. Magalhaes, J. M. N. Vieira, R. Gomez-Garcia, and N. B. Carvalho, "Bio-inspired hybrid filter bank for software-defined radio receivers," IEEE Trans. on Microw. Theory and Tech., vol. 61, No. 4, pp. 1455-1466, 2013.
E. J. Naglich, A. C. Guyette, "Frequency-Selective Limiters Utilizing Contiguous-Channel Double Multiplexer Topology," IEEE Trans. on Microw. Theory and Tech., vol. 64, No. 9, pp. 2871-2882, 2016.
R. O'Brient, P. Ade, K. Arnold, J. Edwards, G. Engargiola, W. Holzapfel, A. Lee, M. Myers, G. M. Rebeiz, P. Richards, and A. Suzuki, "A log-periodic channelizer for multichroic antenna-coupled tes-bolometers," IEEE Trans. Appl. Supercond., vol. 21, No. 3, pp. 180-183, Jun. 2011.
D. R. Jachowski, "Passive enhancement of resonator Q in microwave notch filters," in IEEE MIT-S Int. Microw. Symp. Dig., pp. 1315-1318, vol. 3., 2004.
D. R. Jachowski, "Compact, frequency-agile, absorptive bandstop filters," in IEEE MIT-S Int. Microw. Symp. Dig., 2005.
P. Phudpong, I. C. Hunter, "Frequency-Selective Limiters Using Nonlinear Bandstop Filters," IEEE Trans. on Microw. Theory and Tech., vol. 57, No. 1, pp. 157-164, 2009.
Y.-C. Ou, and G. M. Rebeiz, "A 20-90 MHz 26-channel cochlear-based channelizer," in IEEE MTT-S Int. Microw. Symp. Dig., 2010, pp. 213-216.
S. Ye, R.R. Mansour, "Design of manifold-coupled multiplexers using superconductive lumped element filters," in IEEE MTT-S Int. Microw. Symp. Dig., 1994, pp. 191-194.

* cited by examiner

300

400

1500

1600

1900

2000

2800

2900

COCHLEA-BASED MICROWAVE CHANNELIZER

FEDERALLY SPONSORED RESEARCH AND DEVELOPMENT

The Cochlea-Based Microwave Channelizer is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 105184.

BACKGROUND OF THE INVENTION

As multi-functional RF systems become more ubiquitous, the need increases for receivers to handle larger bandwidths. Although this is desirable, designing wideband receivers can be very challenging. Issues such as saturation and intermodulation distortion due to high power interferers can limit the allowable bandwidth a wideband receiver can accept. For this reason, channelizing filters can be especially desirable. Channelization splits the wide bandwidths into smaller portions, limiting detrimental effects to other channels when one channel is degraded while preserving high selectivity. A need exists for a channelizer that operates at microwave frequencies and does not use lumped elements, which can degrade performance.

DETAILED DESCRIPTION OF SOME EMBODIMENTS

Figure 1:
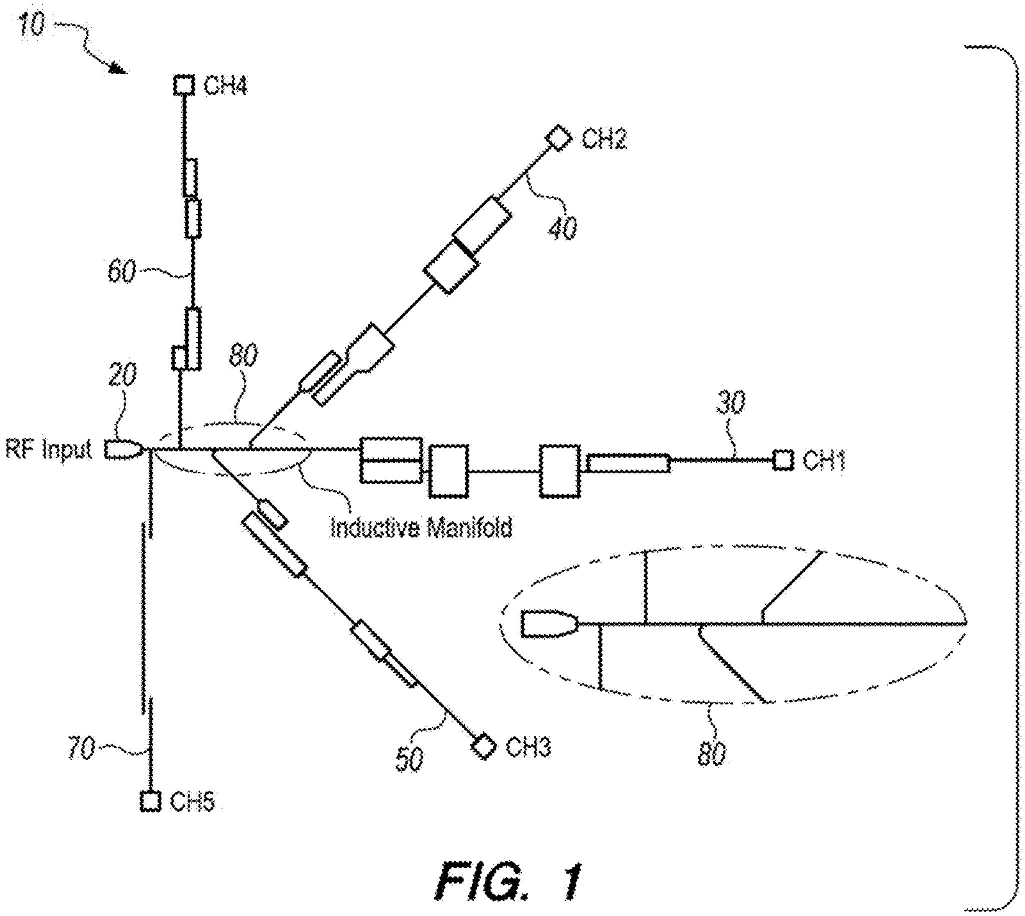
FIG. 1 shows an embodiment of a system in accordance with the disclosed embodiments.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The embodiments relate to a cochlea-based channelizer operating at microwave frequencies, such as within the C-band and X-band, that may be used to protect wideband receivers. The system is realized using high-Q transmission lines to form channel filter elements, vice traditional lumped elements. Generally, $$Q = \frac{\text{Energy Stored}}{\text{Power Lost}}.$$

As used herein, "high-Q" refers to a Q value of greater than about 50. As an example, in some embodiments the Q value may be between about 50 and about 100. In other embodiments, the Q value may be slightly lower than 50 or slightly greater than 100 and may still be considered "high", depending upon the particular system configuration. The use of high-Q transmission lines improves the insertion loss a great deal and improves performance. The system could be useful for wideband radios which require receiver protection, such as bent-pipe SATCOM systems, or even software defined radios, which usually have a wideband front-end to support multiple frequency bands.

Using a Cochlea approach, closer to the RF input the Cochlea channelizer drops out higher frequency signals and decreases in frequency as it moves away from the RF input. This channelizer operates such that the channel filters behave like series RLC resonators. The channel filters also have matched impedance at their resonance frequency, but look like an open circuit at frequencies much higher and lower than the resonance frequency.

Figure 22:
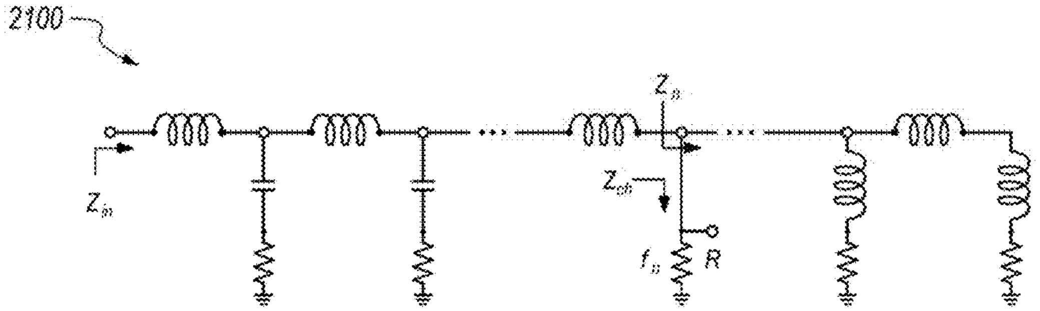
FIG. 22 shows a diagram illustrating a circuit representation of an embodiment of the inductive manifold of the system shown in FIG. 1.

For the Cochlea-based channelizer, the input impedance of each of the channel filters behaves as a series resonator, as well as appears as a short circuit at resonance and an open circuit at all other frequencies. The channel filters typically have an input impedance of between 5-20Ω so that component values are reasonable. Because the channel filters have low impedance, the impedance must be stepped up to be matched to the input impedance of 50Ω. It should be recognized that other input impedance values may be used with corresponding modifications to the input impedance values of the channel filters. As such, the channel filters are coupled through an inductive manifold. The inductive manifold forms an up-converting ladder network, such as that shown in diagram 2100 of FIG. 22, transforming the channel impedance to the input impedance.

FIG. 1 shows an embodiment of a system 10 in accordance with the disclosed embodiments. System 10 includes an RF input 20 coupled to a plurality of channel filters 30, 40, 50, 60, and 70, through an inductive manifold 80. It should be recognized that although system 10 includes five contiguous channel filters, more or less channel filters may be used depending upon the particular design requirement such as available space, materials, and desired frequency range of operation. System 10 may be configured on various types of substrate materials depending upon particular design requirements (e.g. strength, ease of manufacture, cost, etc. . . . ) as would be recognized by a person having ordinary skill in the art. For example, a high-dielectric constant substrate, such as a ceramic substrate, may be used to miniaturize the design of system 10.

Typically, channel filters in a channelizer are realized using lumped elements. However, at microwave frequencies, this is not possible because of low self-resonant frequencies of surface mount inductors and capacitors. Instead, transmission line equivalent circuits are adopted in the embodiments disclosed herein. Series inductors are realized as high-Q transmission lines. Series capacitors are realized using edge coupled transmission lines. Shunt capacitors to ground are realized using wide transmission lines which have a parallel plate capacitance to ground. In some embodiments, the high-Q transmission lines comprise micro-strip transmission lines, in other embodiments co-planar waveguide transmission lines, and in other embodiments substrate integrated waveguide transmission lines. Minimum feature size of the channelizer is the edge coupled transmission lines, which may have a gap size of about 1 mil.

Figure 2:
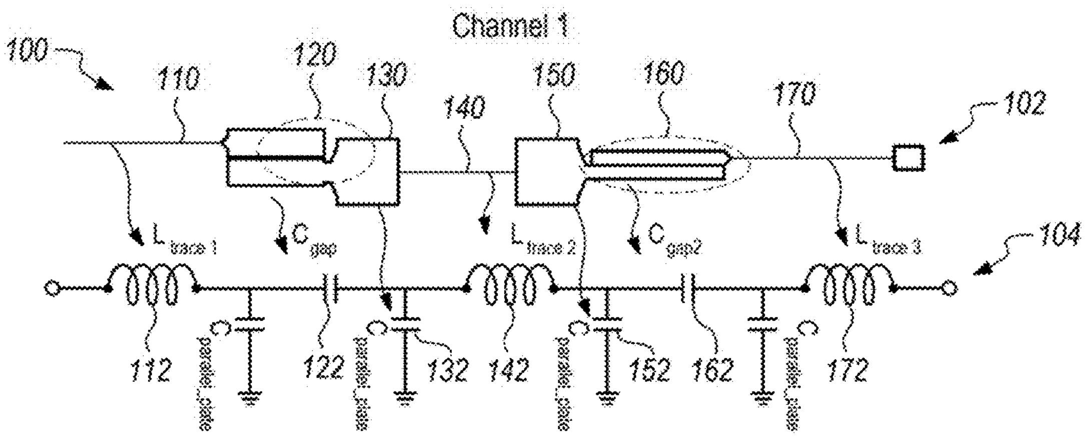
FIG. 2 shows a high-level diagram illustrating an embodiment of a first channel filter of the system shown in FIG. 1 along with its circuit representation.
Figure 6:
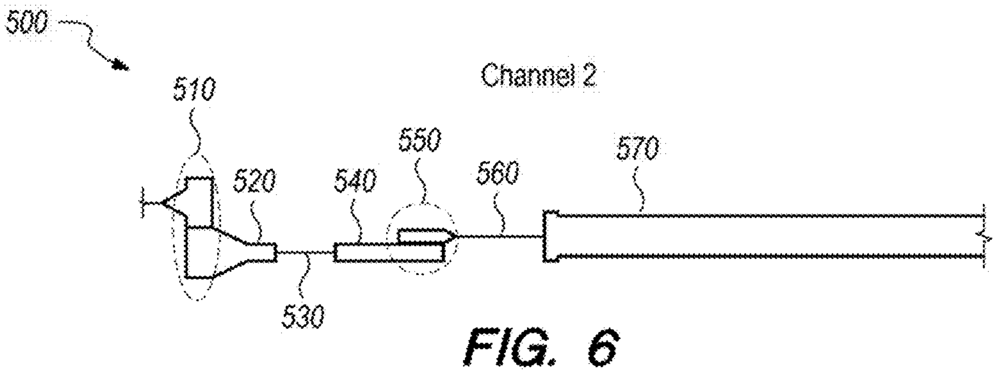
FIG. 6 shows a high-level diagram illustrating an embodiment of a second channel filter of the system shown in FIG. 1.
Figure 10:
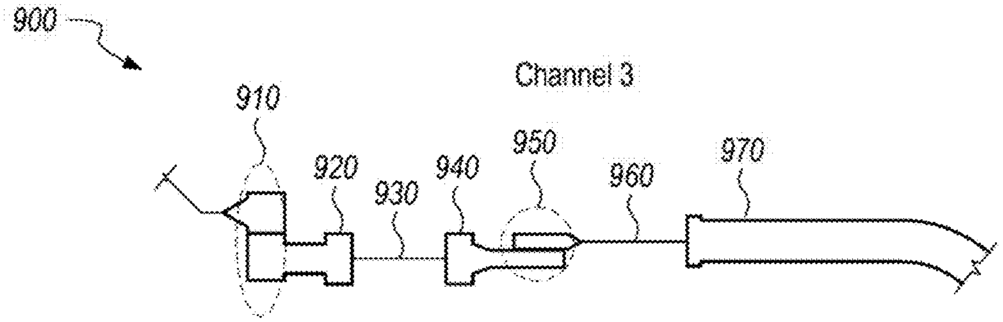
FIG. 10 shows a high-level diagram illustrating an embodiment of a third channel filter of the system shown in FIG. 1.
Figure 14:
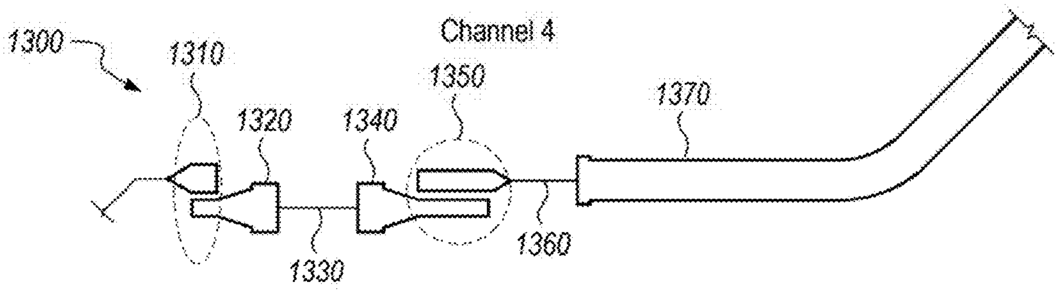
FIG. 14 shows a high-level diagram illustrating an embodiment of a fourth channel filter of the system shown in FIG. 1.
Figure 18:
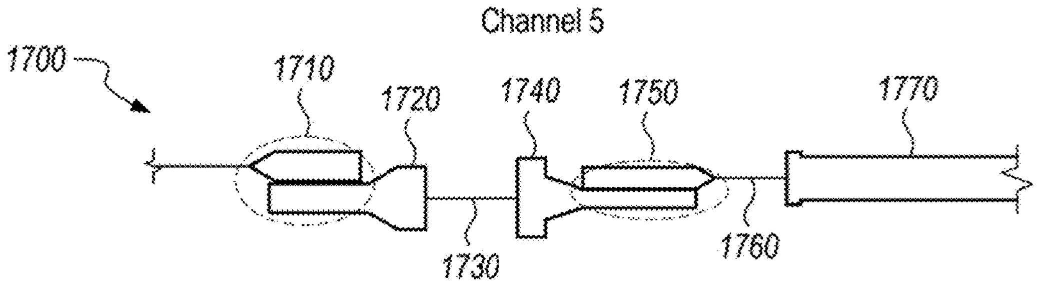
FIG. 18 shows a high-level diagram illustrating an embodiment of a fifth channel filter of the system shown in FIG. 1.

This is illustrated in FIG. 2, which shows a high-level diagram 100 illustrating an embodiment of a channel filter 1 30 of the system shown in FIG. 1. Diagram 100 shows the transmission line representation 102 at the top of FIG. 2 along with its circuit representation 104 at the bottom of FIG. 2. Diagram 500 of FIG. 6 shows a transmission line representation for channel filter 2 40, diagram 900 of FIG. 10 shows a transmission line representation for channel filter 3 50, diagram 1300 of FIG. 14 shows a transmission line representation for channel filter 4 60, and diagram 1700 of FIG. 18 shows a transmission line representation for channel filter 5 60. For each of the channels, each of the plurality of channel filters is configured as a series resonator, including series inductors and capacitors along with shunt capacitors, as shown in the circuit representation.

Referring back to FIG. 2, in the transmission line representation 102 shown in the top of FIG. 2, the length and width of transmission line is varied to create a series inductor, to change the parallel plate capacitance of any shunt capacitor, and to represent series manifold inductors. The length and width of edge coupled transmission lines is used to represent the series gap capacitance. As such, narrow transmission line 110 is used to represent a series inductor 112, a wider edge coupled transmission line 120 is used to represent a series capacitor 122, a wide transmission line 130 is used to represent a shunt capacitor 132, a narrow transmission line 140 is used to represent a series inductor 142, a wide transmission line 150 is used to represent a shunt capacitor 152, a wider edge coupled transmission line 160 is used to represent a series capacitor 162, and a narrow transmission line 170 is used to represent a series inductor 172. It should be noted that each of these elements may be varied in length, width, etc. . . . , to tune the channel filter to provide the appropriate frequency response.

Referring now to FIG. 6, diagram 500 representing one embodiment of channel filter 2 includes a wide edge coupled transmission line 510 representing a series capacitor, a wide transmission line 520 representing a shunt capacitor, narrow transmission line 530 representing a series inductor, a wide transmission line 540 representing a shunt capacitor, a narrower edge coupled transmission line 550 representing a series capacitor, a narrow transmission line 560 representing a series inductor, and a wide transmission line 570 representing a series inductor.

Referring now to FIG. 10, diagram 900 representing one embodiment of channel filter 3 includes a wide edge coupled transmission line 910 representing a series capacitor, a wide transmission line 920 representing a shunt capacitor, narrow transmission line 930 representing a series inductor, a wide transmission line 940 representing a shunt capacitor, a narrower edge coupled transmission line 950 representing a series capacitor, a narrow transmission line 960 representing a series inductor, and a wide transmission line 970 representing a series inductor.

Referring now to FIG. 14, diagram 1300 representing one embodiment of channel filter 4 includes a wide edge coupled transmission line 1310 representing a series capacitor, a wide transmission line 1320 representing a shunt capacitor, a narrow transmission line 1330 representing a series inductor, a wide transmission line 1340 representing a shunt capacitor, an edge coupled transmission line 1350 representing a series capacitor, a narrow transmission line 1360 representing a series inductor, and a wide transmission line 1370 representing a series inductor.

Referring now to FIG. 18, diagram 1700 representing one embodiment of channel filter 5 includes a wide edge coupled transmission line 1710 representing a series capacitor, a wide transmission line 1720 representing a shunt capacitor, a narrow transmission line 1730 representing a series inductor, a wide transmission line 1740 representing a shunt capacitor, a narrower edge coupled transmission line 1750 representing a series capacitor, a narrow transmission line 1760 representing a series inductor, and a wide transmission line 1770 representing a series inductor.

Each of the plurality of channel filters is configured to have a frequency of greater than about 1 GHz. A closest one of the plurality of channel filters, channel 5 70, has the highest frequency of the plurality of channel filters. The frequency of each of the plurality of channel filters decreases as the distance of the plurality of channel filters from the RF input 20 increases. Thus, channel 4 60 has the second highest frequency, channel 3 50 has the third highest frequency, channel 2 40 has the fourth highest frequency, and channel 1 30 has the lowest frequency.

System 10 may be configured to operate in frequency ranges greater than 1 GHz. As an example, system 10 may be configured to operate in the C-band, where each of the plurality of channel filters has a frequency within the range of about 3 GHz and about 8 GHz. To enable operation in different frequency ranges, the design of the components, such as lengths and widths of the transmission lines and components, are varied. As an example, the channel bandwidths of system 10 may be greater than about 0.74 GHz. A system operating in the C-band may be formed, as an example, on a 40-mil Rogers 4350b substrate, where $\varepsilon_r$=3.66, δ=0.0037. Further, each channel filter may be designed for approximately 15% fractional bandwidth across the center frequency.

Once each channel filter 30, 40, 50, 60, and 70 has been designed, they are aggregated and coupled via inductive manifold 80, which is comprised of high impedance inductive traces. As an example, the trace width of the high impedance lines is 6 mils, but other widths may be used. Once the filters are connected to inductive manifold 80, further channel filter optimization may be required as distributed effects are prominent at microwave frequencies.

Figure 3:
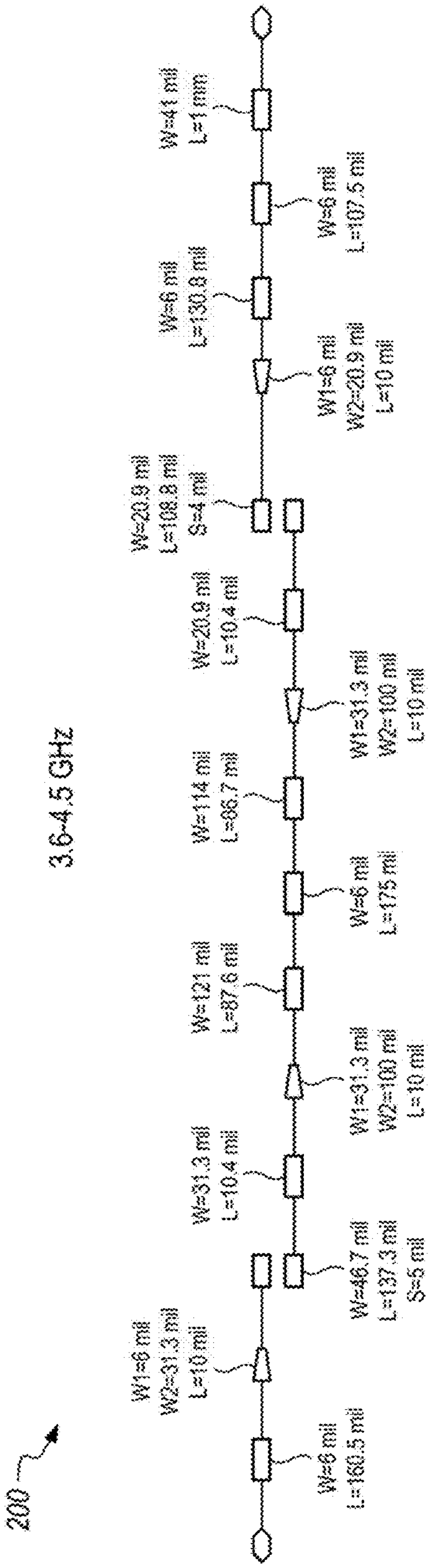
FIG. 3 shows a diagram representing the detailed components of the first channel filter shown in FIG. 2.
Figure 7:
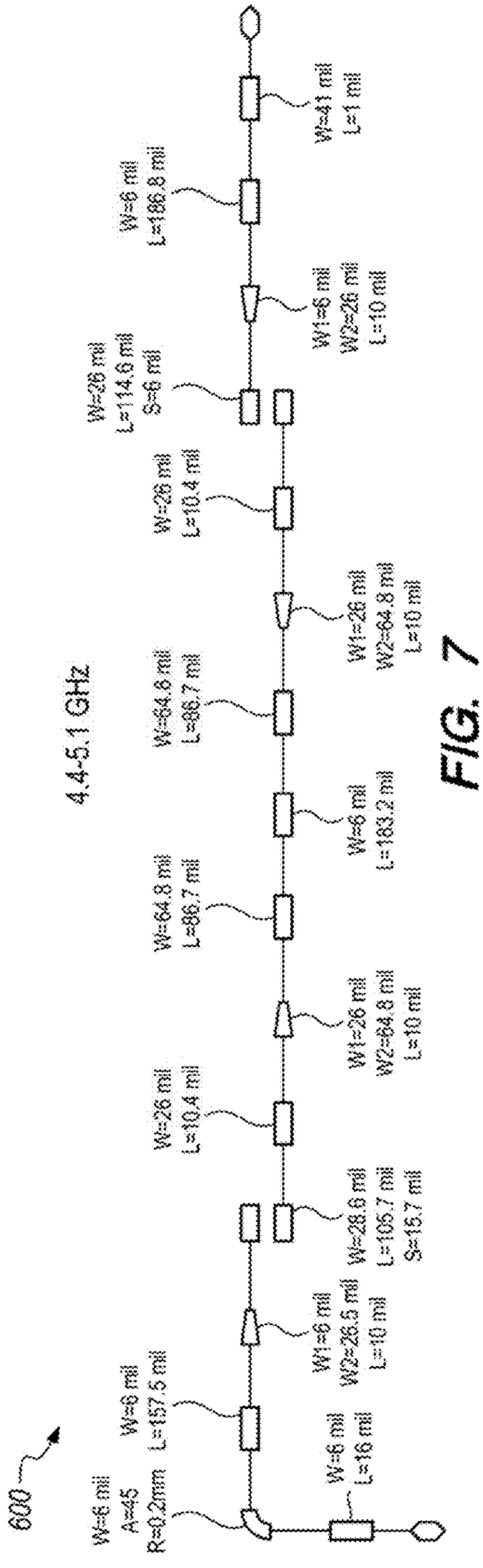
FIG. 7 shows a diagram representing the detailed components of the second channel filter shown in FIG. 6.
Figure 11:
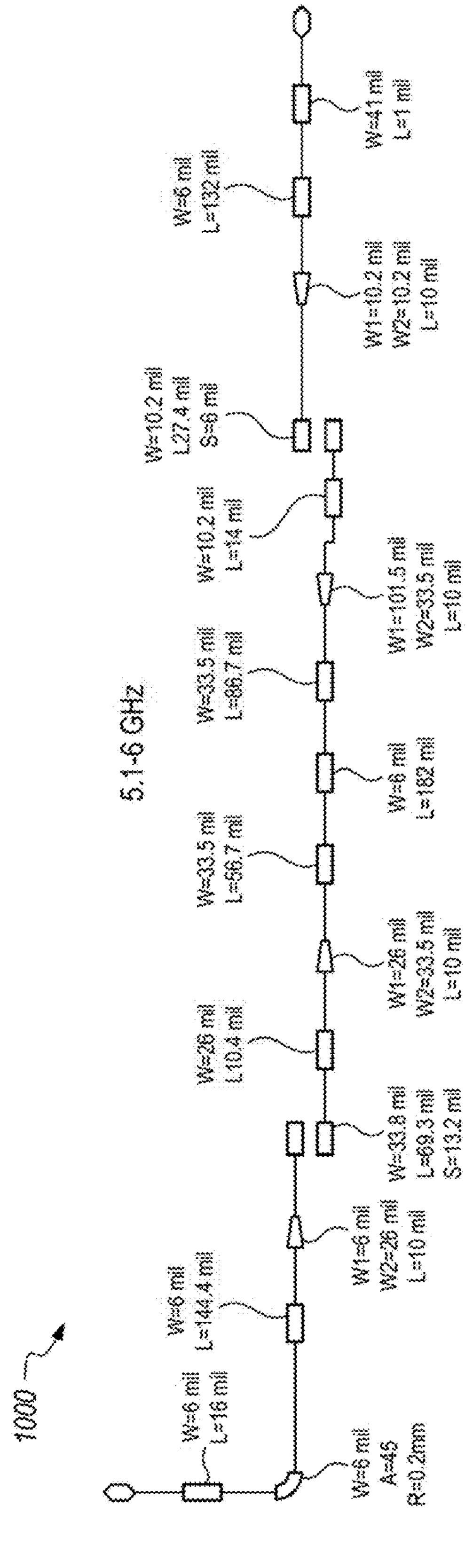
FIG. 11 shows a diagram representing the detailed components of the third channel filter shown in FIG. 10.
Figure 15:
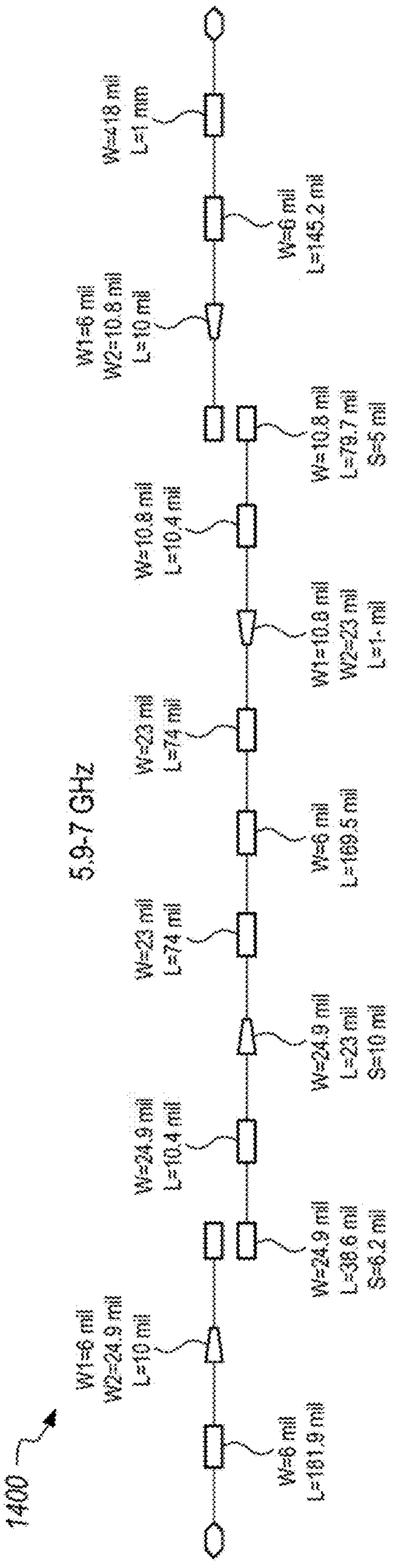
FIG. 15 shows a diagram representing the detailed components of the fourth channel filter shown in FIG. 14.
Figure 19:
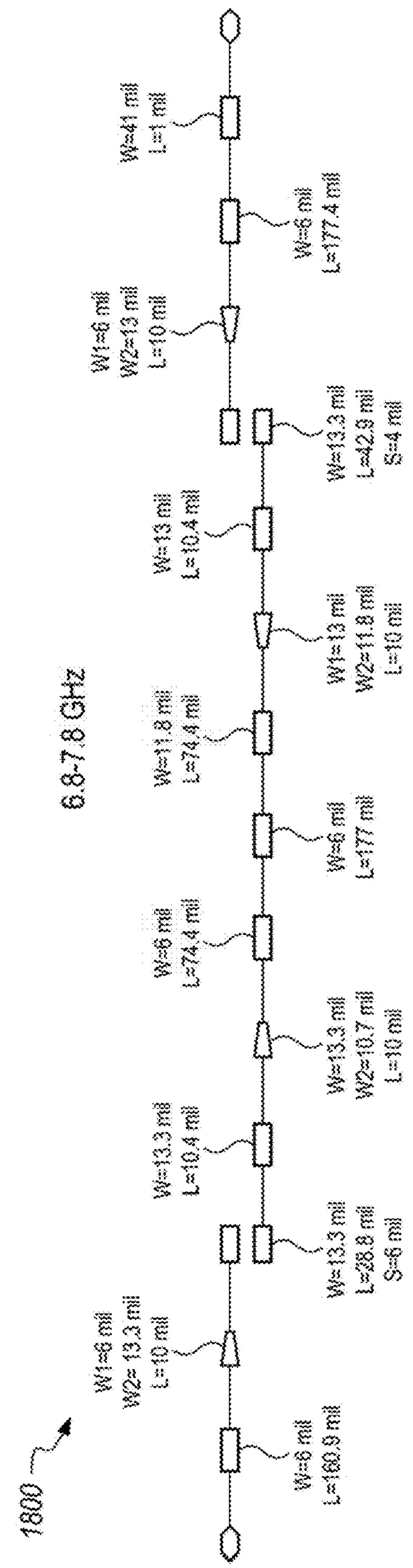
FIG. 19 shows a diagram representing the detailed components of the fifth channel filter shown in FIG. 18.

FIGS. 3, 7, 11, 15, and 19 show the different frequency ranges for each of the channel filters for an embodiment of system 10 operating in the C-band. As shown in FIG. 3, diagram 200 illustrates the specific components of channel filter 1 to allow operation within a frequency range of about 3.6 GHz to about 4.5 GHz. As shown in FIG. 7, diagram 600 illustrates the specific components of channel filter 2 to allow operation within a frequency range of about 4.4 GHz to about 5.1 GHz. As shown in FIG. 11, diagram 1000 illustrates the specific components of channel filter 3 to allow operation within a frequency range of about 5.1 GHz to about 6 GHz. As shown in FIG. 15, diagram 1400 illustrates the specific components of channel filter 4 to allow operation within a frequency range of about 5.9 GHz to about 7 GHz. As shown in FIG. 19, diagram 1800 illustrates the specific components of channel filter 5 to allow operation within a frequency range of about 6.8 GHz to about 7.8 GHz.

As another example, system 10 may be configured to operate within the X-band, where each of the plurality of channel filters has a frequency within the range of about 6 GHz and about 13 GHz. System 10 may be configured to operate in different frequency bands/ranges depending upon factors including the number of channel filters, the substrate used, the length/width of the transmission lines, etc. A system operating in the X-band may be formed, as an example, using a 20-mil fused silica quartz substrate, where $\varepsilon_r$=3.8 and δ=0.00006.

Figure 4:
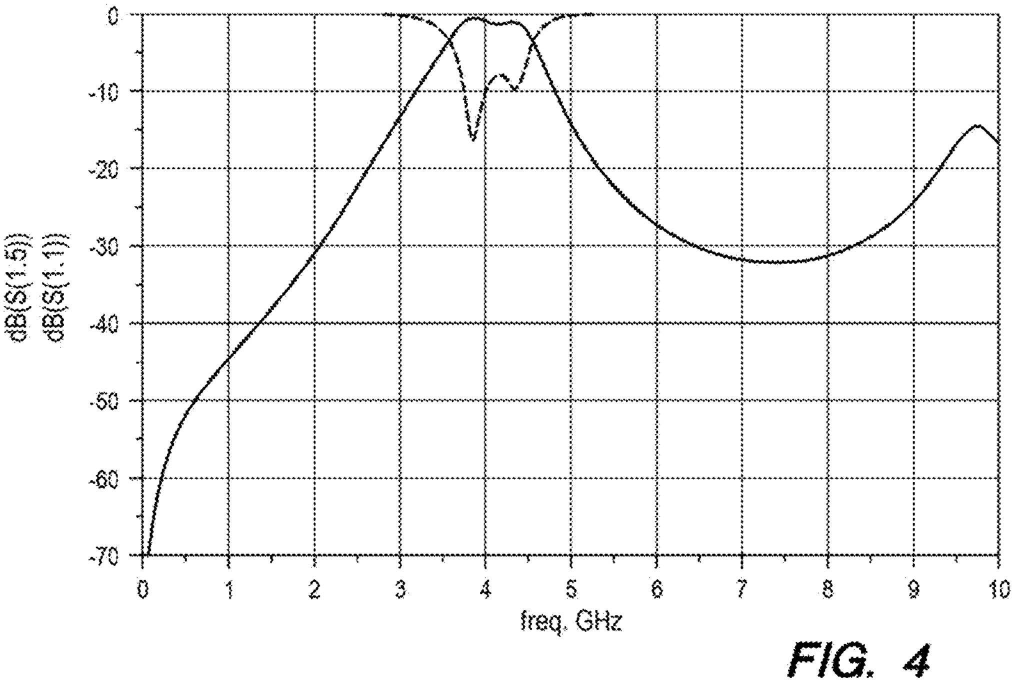
FIG. 4 shows a graph illustrating the frequency response of the first channel filter shown in FIG. 2.
Figure 8:
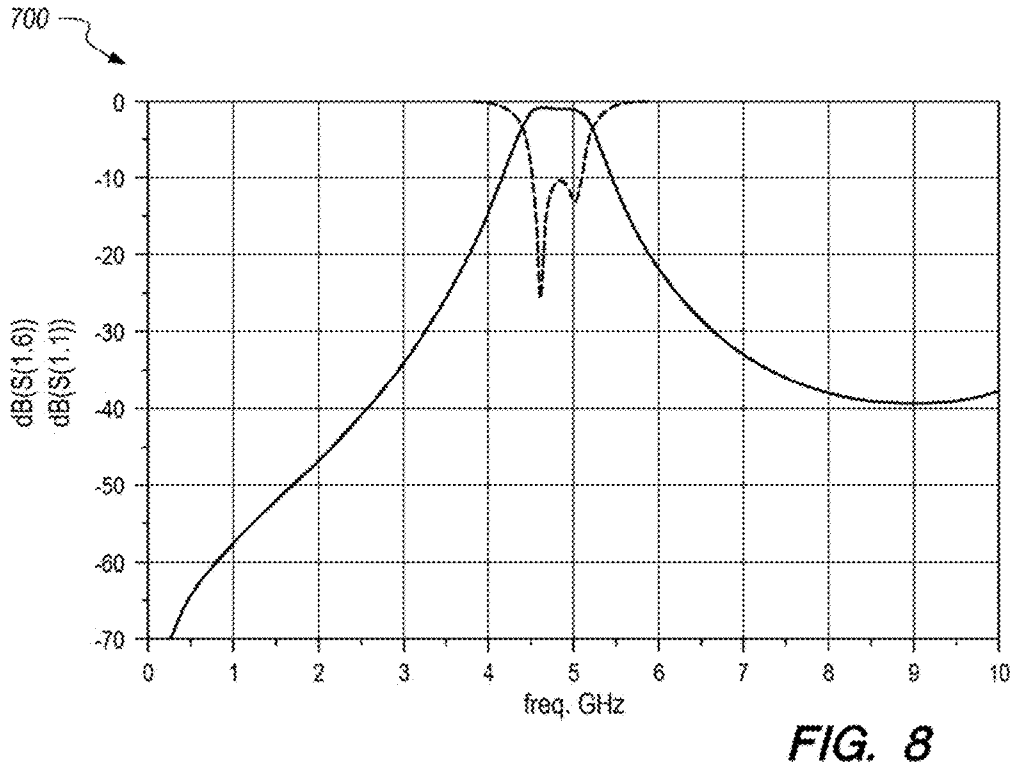
FIG. 8 shows a graph illustrating the frequency response of the second channel filter shown in FIG. 6.
Figure 12:
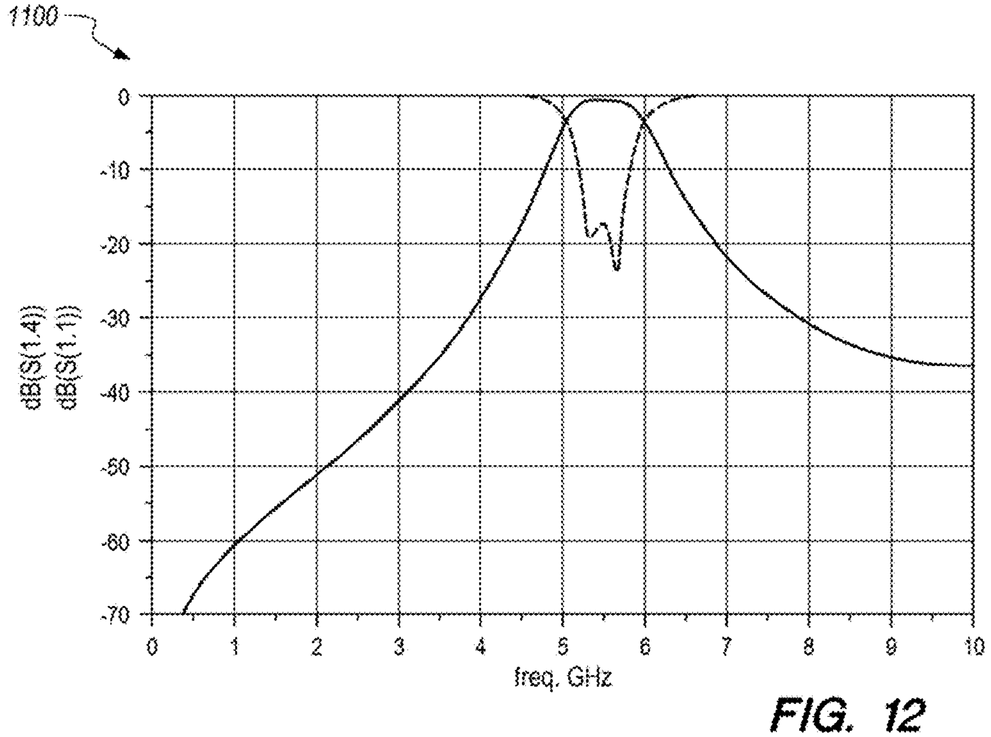
FIG. 12 shows a graph illustrating the frequency response of the third channel filter shown in FIG. 10.
Figure 16:
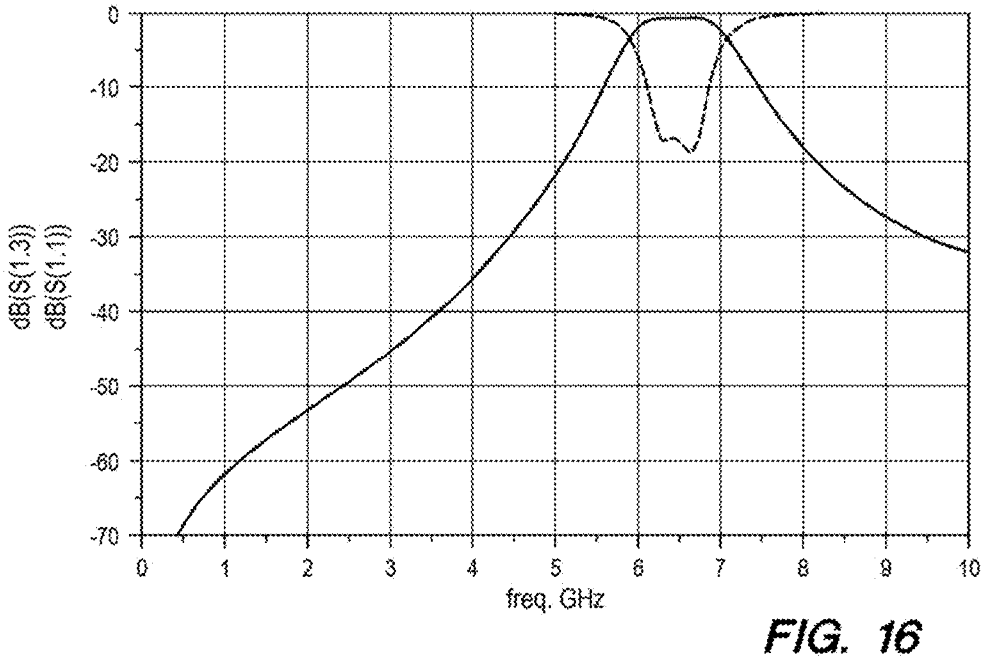
FIG. 16 shows a graph illustrating the frequency response of the fourth channel filter shown in FIG. 14.
Figure 20:
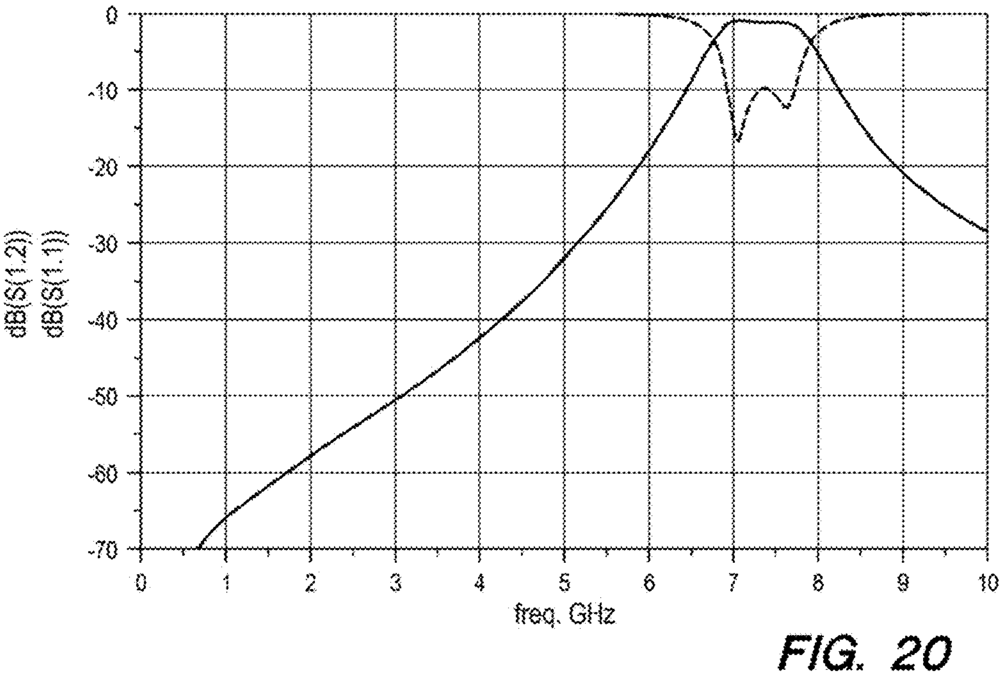
FIG. 20 shows a graph illustrating the frequency response of the fifth channel filter shown in FIG. 18.

FIGS. 4, 8, 12, 16, and 20 show graphs illustrating the channel response of the channel filters of system 10. FIG. 4 shows a diagram 300 illustrating the response for channel filter 1, FIG. 8 shows a diagram 700 illustrating the response for channel filter 2, FIG. 12 shows a diagram 1100 illustrating the response for channel filter 3, FIG. 16 shows a diagram 1500 illustrating the response for channel filter 4, and FIG. 20 shows a diagram 1900 illustrating the response for channel filter 5. These figures show the insertion loss (S21) and the return loss (S11). The insertion loss is a measure of the transmission across frequency. As a channel filter, the response should show maximum transmission in the pass band and maximum attenuation in the stop bands. The return loss is a measure of how well matched the impedances are, where less than 10 dB is generally acceptable and considered well-matched.

Figure 5:
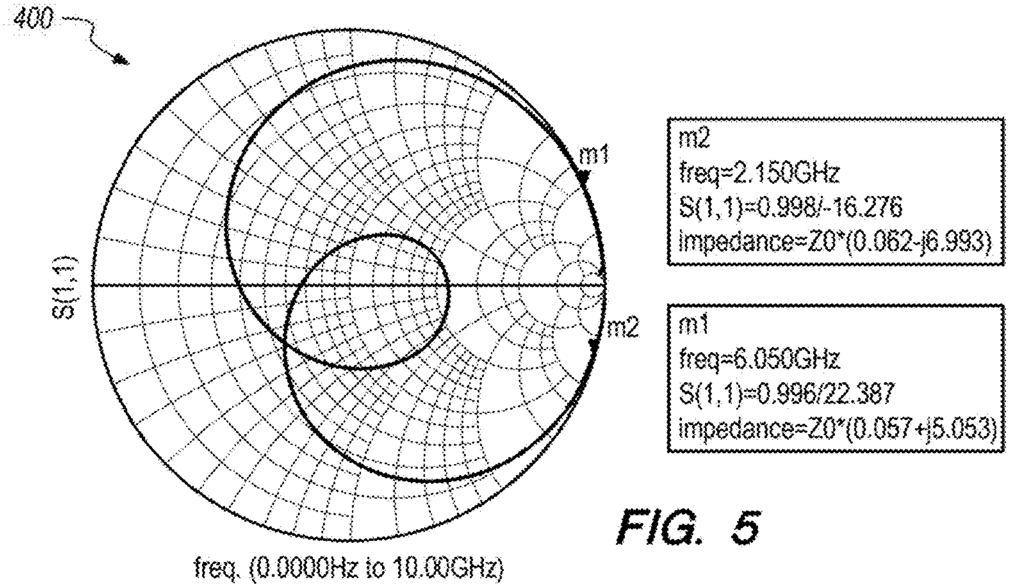
FIG. 5 shows a graph illustrating the input impedance of the first channel filter shown in FIG. 2.
Figure 9:
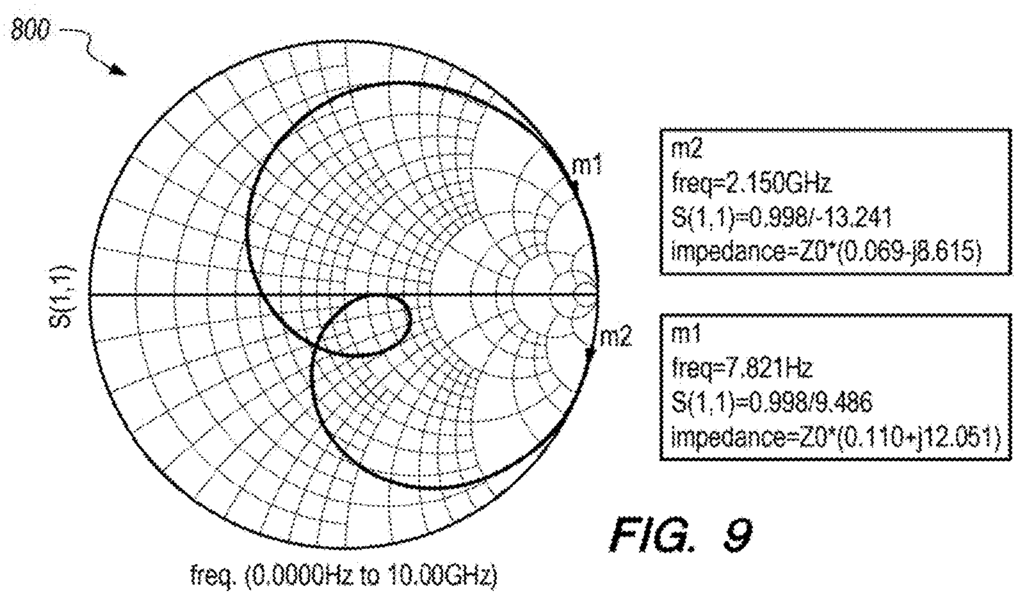
FIG. 9 shows a graph illustrating the input impedance of the second channel filter shown in FIG. 6.
Figure 13:
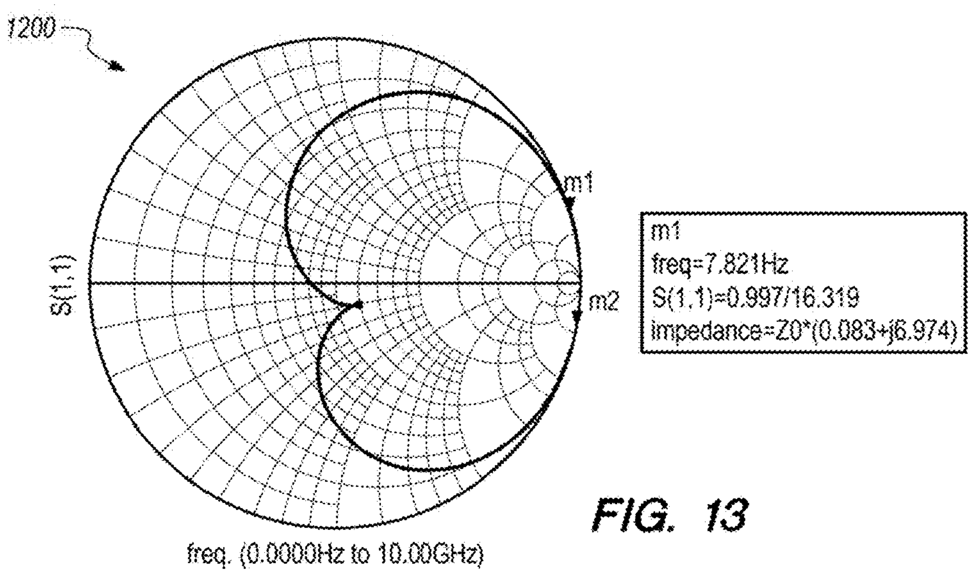
FIG. 13 shows a graph illustrating the input impedance of the third channel filter shown in FIG. 10.
Figure 17:
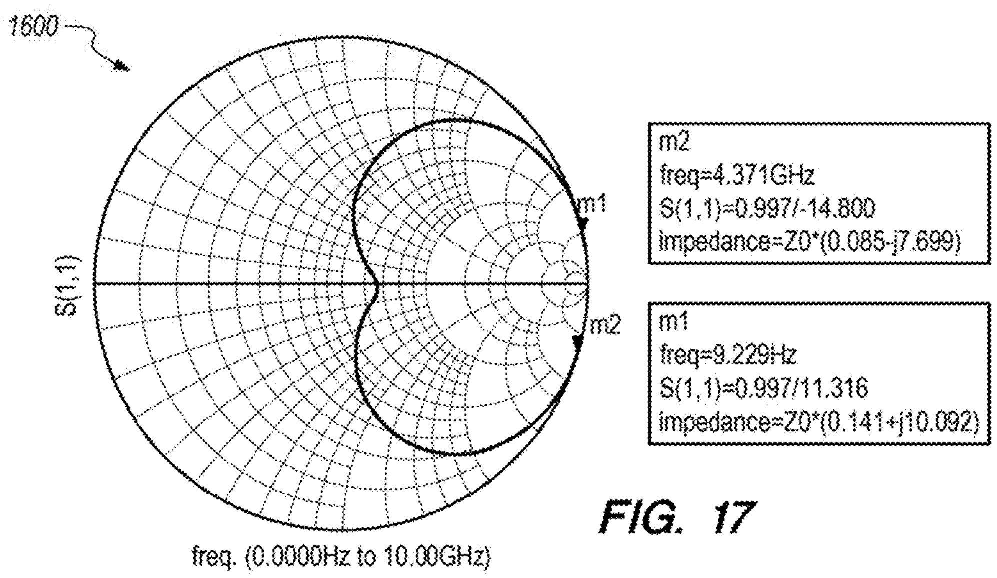
FIG. 17 shows a graph illustrating the input impedance of the fourth channel filter shown in FIG. 14.
Figure 21:
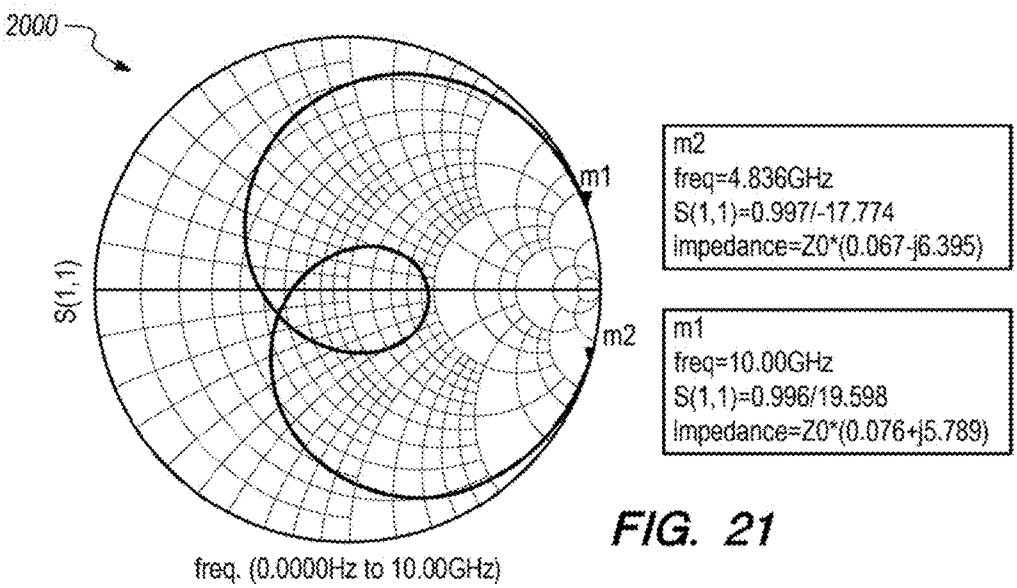
FIG. 21 shows a graph illustrating the input impedance of the fifth channel filter shown in FIG. 18.

FIGS. 5, 9, 13, 17, and 21 show graphs illustrating the input impedance of the channel filters of system 10. FIG. 5 shows a diagram 400 illustrating the input impedance for channel filter 1, FIG. 9 shows a diagram 800 illustrating the response for channel filter 2, FIG. 13 shows a diagram 1200 illustrating the input impedance for channel filter 3, FIG. 17 shows a diagram 1600 illustrating the input impedance for channel filter 4, and FIG. 21 shows a diagram 2000 illustrating the input impedance for channel filter 5. As can be seen, the input impedance on the smith chart for each channel filter shows a response where at the resonant frequency, the filter is matched, and at frequencies much higher and lower than the resonant frequency, the impedance is close to an open circuit.

Figure 23:
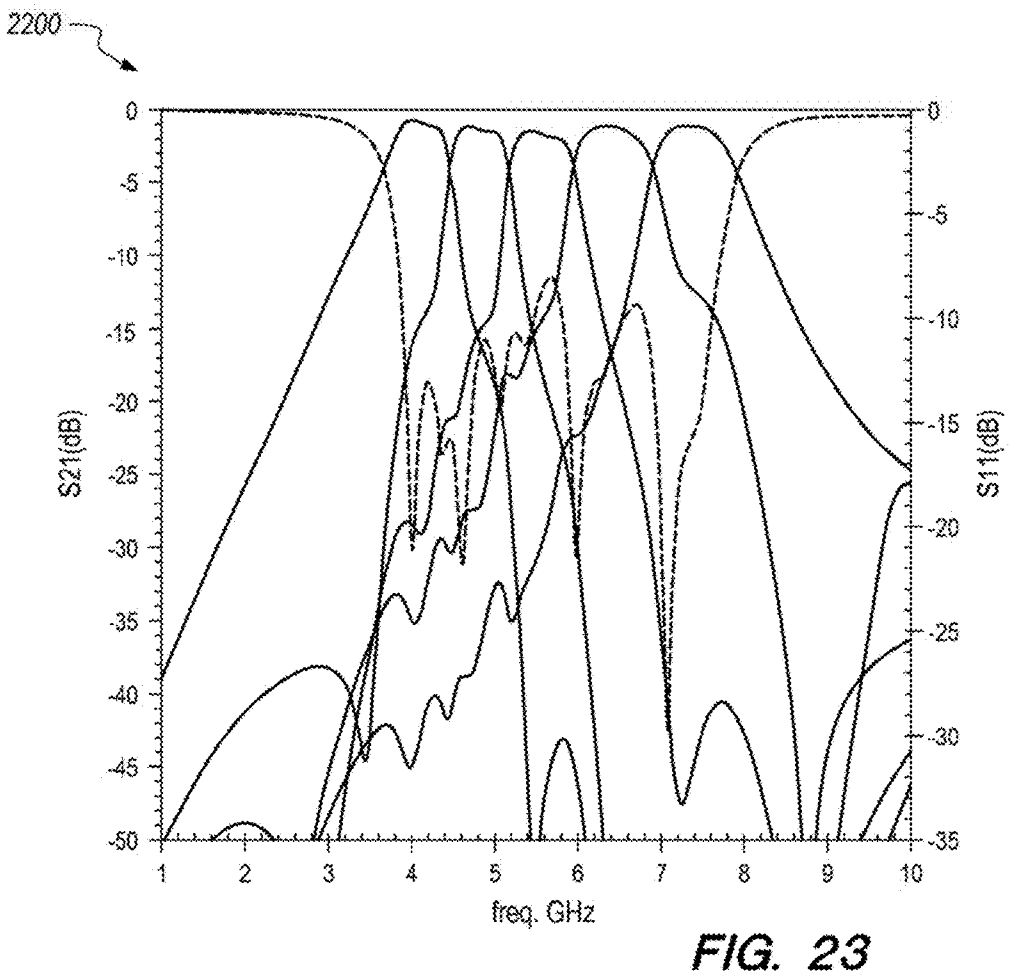
FIG. 23 shows a graph illustrating schematic level transmission line simulations of the system shown in FIG. 1.

Schematic level transmission line simulations were performed and are shown in graph 2200 shown in FIG. 23. As shown, the channelizer covers all of C-band and maintains a return loss of better than 10 dB. Each of the channel filters cover over 0.74 GHz of bandwidth. The adjacent band rejection can be improved by employing higher order channel filters; however, this is at the expense of incurring a higher insertion loss due to longer channel filters.

Figure 24:
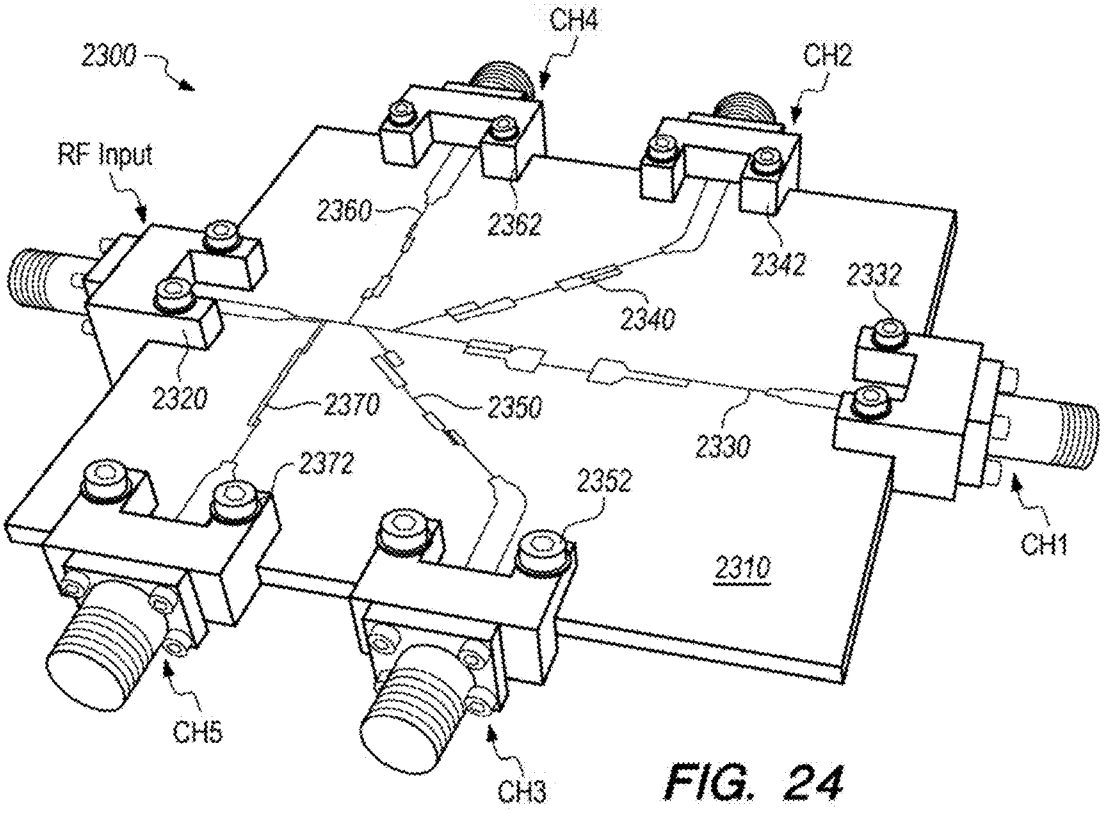
FIG. 24 shows a diagram illustrating a hardware configuration of an embodiment of the system shown in FIG. 1 operating in the C frequency band.

FIG. 24 shows a diagram illustrating a hardware configuration of an embodiment of a system 2300, similar to the system shown in FIG. 1, configured to operate in the C-band. System 2300 includes a substrate 2310, an RF input 2320 coupled to a plurality of channel filters 2330, 2340, 2350, 2360, and 2370 via an inductive manifold. Channel filter 1 2330 has an output 2332, channel filter 2 2340 has an output 2342, channel filter 3 2350 has an output 2352, channel filter 4 2360 has an output 2362, and channel filter 5 2370 has an output 2372.

The S-parameters of system 2300 were measured using a vector network analyzer. A custom Thru-Reflect-Lin (TRL) calibration kit was designed and used to de-embed both the coaxial fixtures used for the measurements, and also 5.5 mm of 50Ω transmission line in order to reduce measurement loss. The input reflection coefficient is measured when all channel outputs are loaded with a 50Ω termination. The transmission response of a single channel is measured when all other channels are terminated with 50Ω loads.

Figure 25:
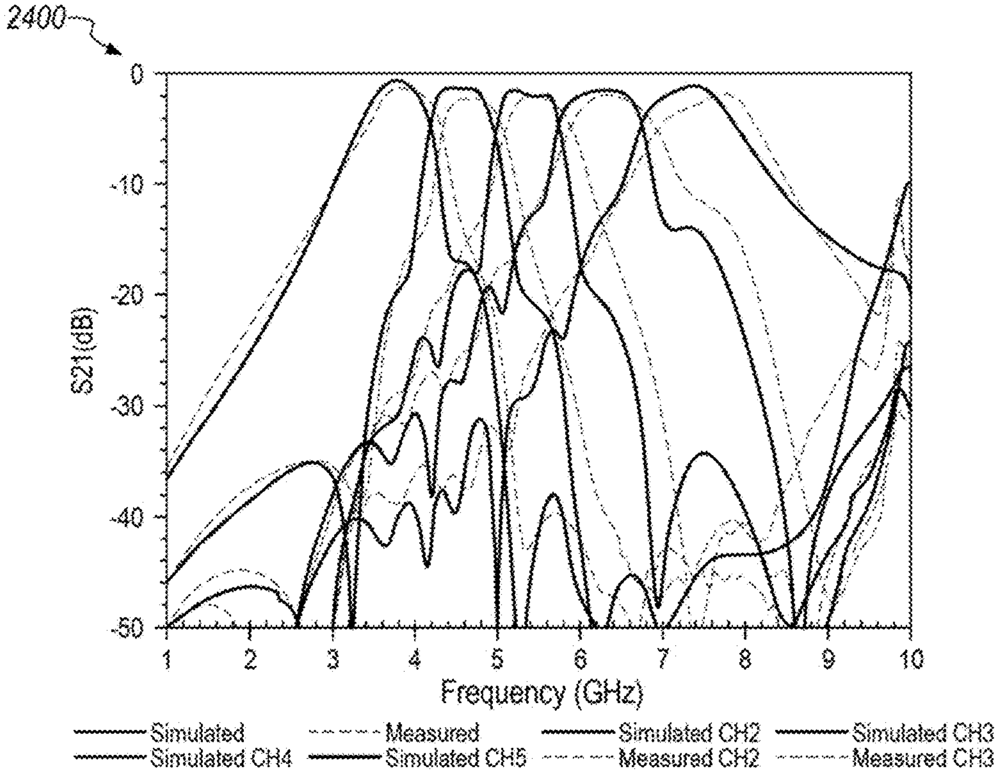
FIG. 25 shows a graph illustrating the measured and simulated transmission coefficient of the system shown in FIG. 24.
Figure 26:
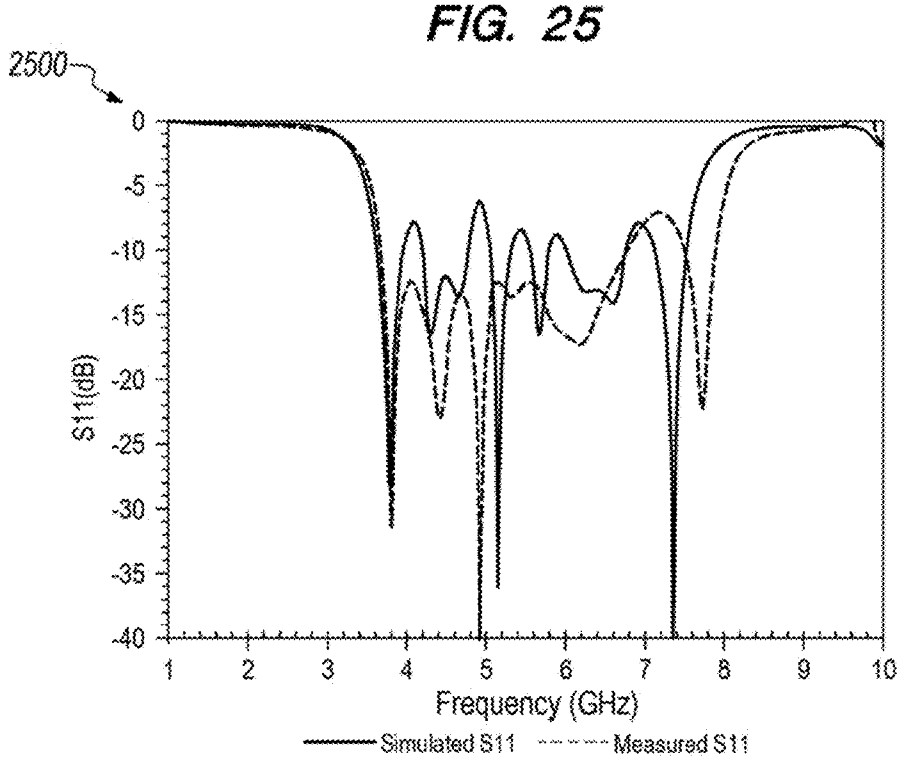
FIG. 26 shows a graph illustrating the measured and simulated reflection coefficient of the system shown in FIG. 24.

The measured and simulated S-parameters for all five channels are shown in the graphs in FIGS. 25 and 26, respectively. FIG. 25 shows a graph 2400 illustrating the measured and simulated transmission coefficient of system 2300 and FIG. 26 shows a graph 2500 illustrating the measured and simulated reflection coefficient of system 2300. A summary of the measured results are shown in Table 1 below.

TABLE 1

MEASURED CHANNELIZER SPECIFICATIONS

| Ch | Band-edge (GHz) | $\Delta_{3dB}$ (GHz) | I.L. (dB) | Rejection N-1(dB) | Rejection N + 1(dB) |
|---|---|---|---|---|---|
| 1 | 3.45/4.29 | 0.84 | 1.23 | — | 17.16 |
| 2 | 4.32/5.06 | 0.74 | 2.26 | 16.32 | 14.25 |
| 3 | 5.08/5.89 | 0.81 | 2.06 | 17.9 | 11.72 |
| 4 | 5.88/6.90 | 1.02 | 1.92 | 16.11 | 12.53 |
| 5 | 6.92/8.13 | 1.21 | 1.79 | 11.84 | — |

As shown, the channelizer maintains a S11 of better than −10 dB across the majority of the C-band, with exception to a slight mismatch at 4.86 GHz. The measured and simulated responses are fairly well correlated. The 3 dB bandwidth of each of the channel filters are each less than 1 GHz and can be further tuned to provide equal bandwidths. The measured insertion loss at the center frequencies of each channel filter does not exceed 2.26 dB. The crossover point between adjacent channels is around −6 dB. The adjacent channel rejection is measured from the center frequency to the upper and lower adjacent channels and is >11 dB.

Figure 27:
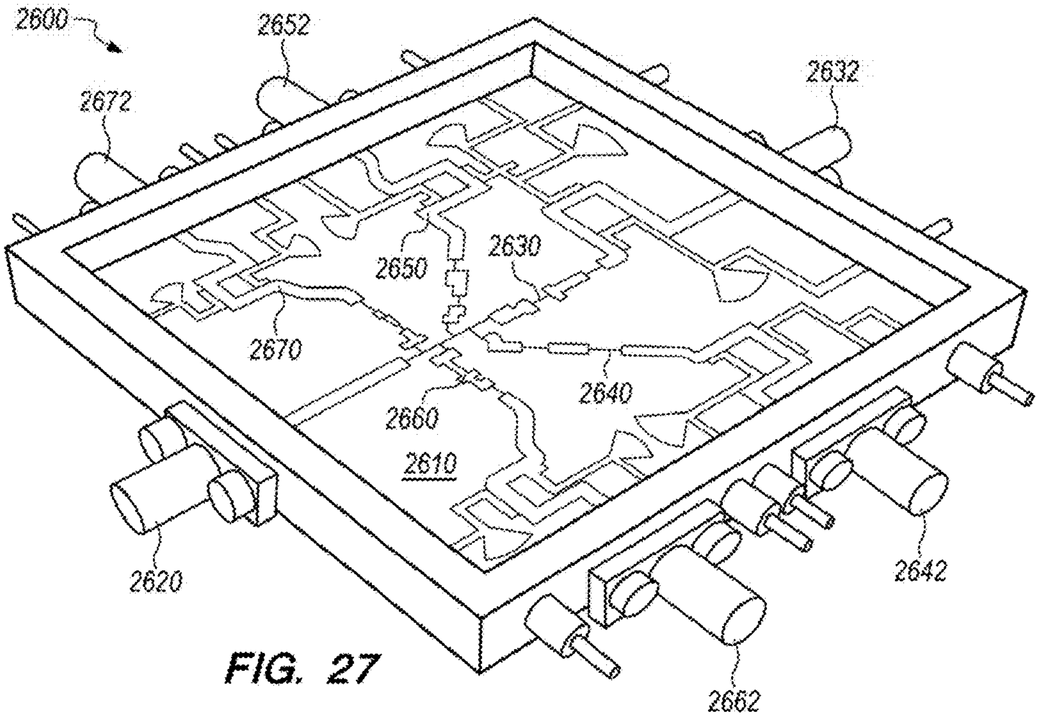
FIG. 27 shows a diagram illustrating a hardware configuration of an embodiment of the system shown in FIG. 1 operating in the X frequency band.
Figure 28:
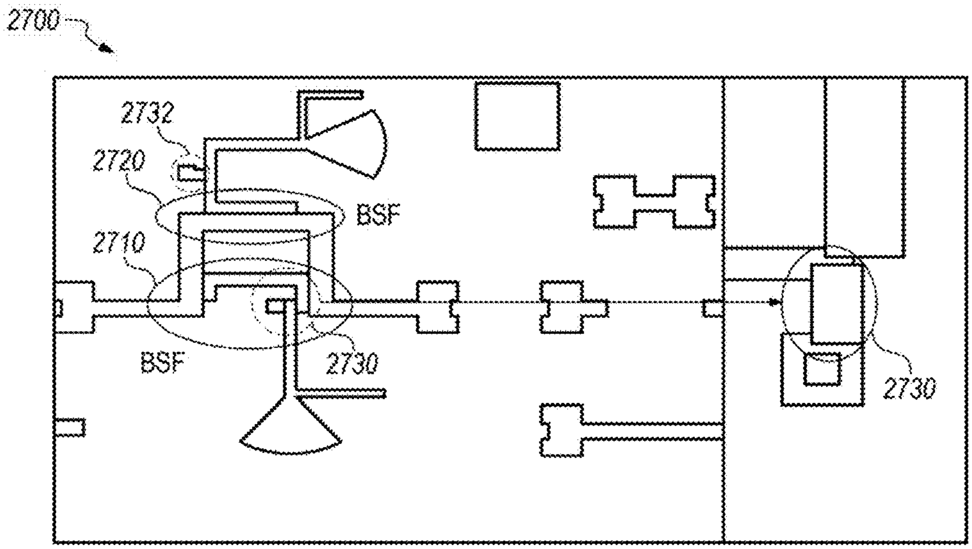
FIG. 28 shows a diagram illustrating a hardware configuration of an absorptive tunable band-stop filter.

FIG. 27 shows a diagram illustrating a hardware configuration of an embodiment of a system 2600, similar to the system shown in FIG. 1, configured to operate in the X-band. System 2600 includes a substrate 2610, an RF input 2620 coupled to a plurality of channel filters 2630, 2640, 2650, 2660, and 2670 via an inductive manifold. Channel filter 1 2630 has an output 2632, channel filter 2 2640 has an output 2642, channel filter 3 2650 has an output 2652, channel filter 4 2660 has an output 2662, and channel filter 5 2670 has an output 2672. Each of the channel filters includes a tunable notch filter therein. As an example, the tunable notch filter may be an absorptive tunable band-stop filter as shown in FIG. 28. In some embodiments, multiple notch filters may be used within a single channel. Flange mounted SMA connectors were used in system 2600 for measurement purposes and DC EMI filters were used to provide voltage biasing to the circuit. The dimensions of system 2600 are 2.7 inches by 2.7 inches, but system 2600 may be scaled up or down as necessary.

FIG. 28 shows a diagram 2700 illustrating a hardware configuration of a tunable notch filter, particularly an absorptive tunable band-stop filter (ABSF) 2700. ABSFs have the capability of achieving high rejection using low quality factor (Q) resonators. A transmission line realized two-path notch filter may be used for the disclosed embodiments. The input signal may be coupled through a band-pass filter (BPF) 2710 to the output, while a portion of the input signal may be coupled through a band-stop filter (BSF) 2720 to the output. The two portions may be phased such that at the designed frequency the two paths are 180° out of phase, resulting in near perfect cancellation. Varactor diodes 2730 and 2732 may be used to load the BPF and BSF in order to make the two filters tunable. As an example, a flip-chip diode such as that shown in the inset diagram may be used for varactor diodes 2730 and 2732.

Quarter-wavelength transmission lines may be used as chokes for DC biasing, with radial stubs being used for bypass capacitors. In some embodiments, separate ABSF filter may be designed for each of the channel filters, with each designed for around 4% fractional bandwidth around the center frequency and with the capability to tune across the full bandwidth of each channel.

Figure 29:
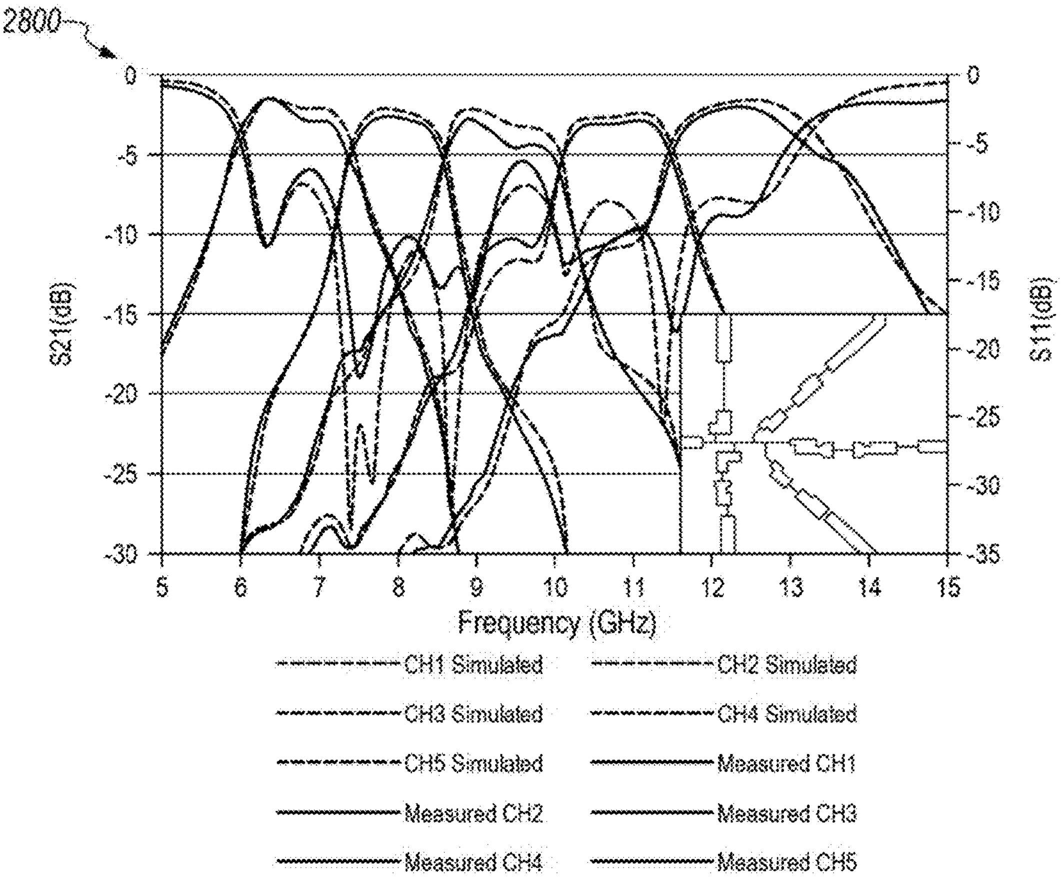
FIG. 29 shows a graph illustrating the measured and simulated response of the system shown in FIG. 27.

FIG. 29 shows a graph 2800 illustrating the measured and simulated response of system 2600 shown in FIG. 27 across all five channels. Table 2 below shows the simulated and measured performance. The insertion loss on channel filter 3 deviates from the simulation, with such deviation being attributed to fabrication tolerance of the edge coupled lines. The average insertion loss is about 3 dB for the entirety of the channelizer and adjacent channel rejection is over 9.8 dB from channel center.

TABLE 2

MEASURED CHANNELIZER SPECIFICATIONS

| Ch | Band-edge (GHz) | $\Delta_{3dB}$ (GHz) | I.L. (dB) | Rejection N-1(dB) | Rejection N + 1(dB) |
|---|---|---|---|---|---|
| 1 | 5.91/7.29 | 1.38 | 2.88 | — | 12.84 |
| 2 | 7.23/8.50 | 1.27 | 2.66 | 12.84 | 12.63 |
| 3 | 8.38/10.1 | 1.72 | 4.56 | 12.63 | 9.80 |
| 4 | 9.96/11.4 | 1.44 | 3.02 | 9.80 | 13.36 |
| 5 | 11.3/13.6 | 2.29 | 2.33 | 13.36 | — |

Figure 30:
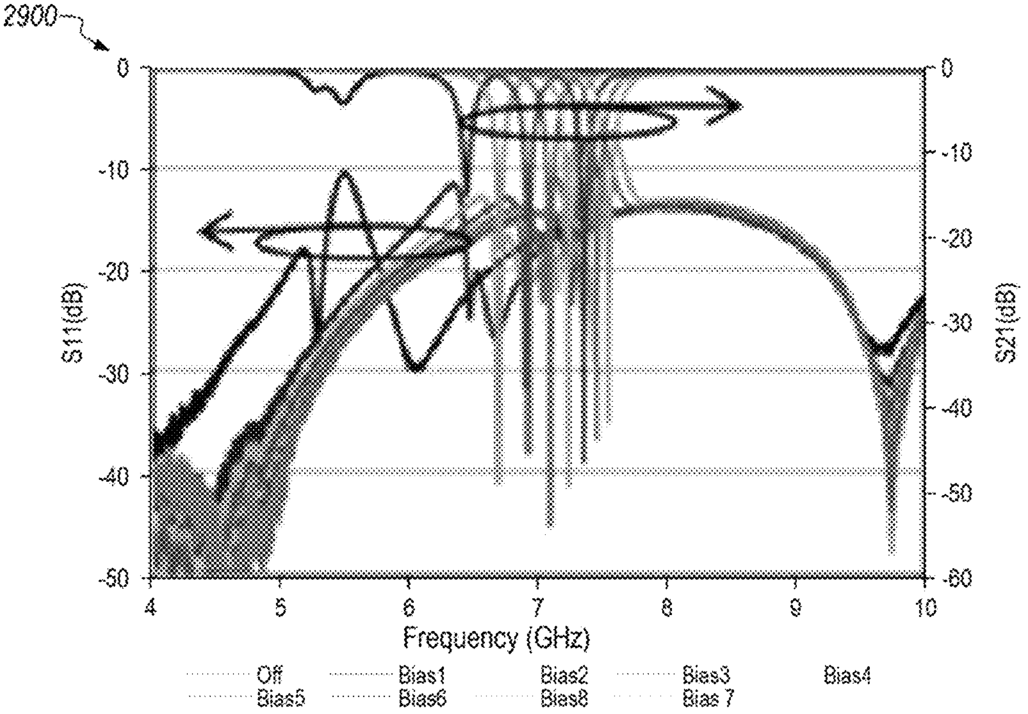
FIG. 30 shows a graph illustrating the frequency response of the absorptive tunable band-stop filter shown in FIG. 28.

FIG. 30 shows a graph 2900 illustrating the frequency response of the ABSF 2700 shown in FIG. 28. As shown, more than 35 dB of attenuation is achieved from 6.6-7.5 GHz with a 3 dB bandwidth of around 170 MHz. The varactor diodes are swept from 0-10V and are designed to be swept simultaneously with the same voltage. The filters were also designed on a 20 mil fused silica quartz substrate.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

I claim:

1. A system comprising:

an RF input coupled to a plurality of channel filters through an inductive manifold, wherein each of the plurality of channel filters is configured as a series resonator and has a frequency of greater than about 1 GHz, wherein a closest one of the plurality of channel filters has a highest frequency of the plurality of channel filters and the frequency of each of the plurality of channel filters decreases as a distance of the plurality of channel filters from the RF input increases, wherein components of each of the plurality of channel filters are configured using high-Q transmission lines.

2. The system of claim 1, wherein the components of each of the plurality of channel filters comprise a series inductor, a series capacitor, and a shunt capacitor, wherein the series inductor is configured using a high impedance transmission line, the series capacitor is configured using an edge coupled transmission line, and the shunt capacitor is configured using a wide transmission line.

3. The system of claim 1, wherein each of the plurality of channel filters has a frequency within a range of about 3 GHz and about 8 GHz.

4. The system of claim 1, wherein each of the plurality of channel filters has a frequency within a range of about 6 GHz and about 13 GHz.

5. The system of claim 1, wherein the high-Q transmission lines comprise micro-strip transmission lines.

6. The system of claim 1, wherein the high-Q transmission lines comprise co-planar waveguide transmission lines.

7. The system of claim 1, wherein the high-Q transmission lines comprise substrate integrated waveguide transmission lines.

8. The system of claim 1, wherein the RF input, the inductive manifold, and the plurality of channel filters are disposed on a ceramic substrate.

9. The system of claim 8, wherein the ceramic substrate is a fused silica quartz substrate.

10. The system of claim 1, wherein at least one of the plurality of channel filters comprises a tunable notch filter therein.

11. The system of claim 10, wherein the tunable notch filter is an absorptive tunable band-stop filter.

12. The system of claim 10, wherein the tunable notch filter is an absorptive tunable band-stop filter.

13. A system comprising:

an RF input coupled to a plurality of channel filters through an inductive manifold, wherein each of the plurality of channel filters is configured as a series resonator, wherein each of the plurality of channel filters has a frequency within a range of about 3 GHz and about 8 GHz, wherein a closest one of the plurality of channel filters has a highest frequency of the plurality of channel filters and the frequency of each of the plurality of channel filters decreases as a distance of the plurality of channel filters from the RF input increases, wherein components of each of the plurality of channel filters are configured using high-Q transmission lines, wherein the components of each of the plurality of channel filters comprise a series inductor, a series capacitor, and a shunt capacitor, wherein the series inductor is configured using a high impedance transmission line, the series capacitor is configured using an edge coupled transmission line, and the shunt capacitor is configured using a wide transmission line.

14. The system of claim 13, wherein the high-Q transmission lines comprise micro-strip transmission lines.

15. The system of claim 13, wherein the high-Q transmission lines comprise co-planar waveguide transmission lines.

16. The system of claim 13, wherein the high-Q transmission lines comprise substrate integrated waveguide transmission lines.

17. The system of claim 13, wherein the RF input, the inductive manifold, and the plurality of channel filters are disposed on a ceramic substrate.

18. A system comprising:

an RF input coupled to a plurality of channel filters through an inductive manifold, wherein each of the plurality of channel filters is configured as a series resonator, wherein each of the plurality of channel filters has a frequency within a range of about 6 GHz and about 13 GHz, wherein a closest one of the plurality of channel filters has a highest frequency of the plurality of channel filters and the frequency of each of the plurality of channel filters decreases as a distance of the plurality of channel filters from the RF input increases, wherein components of each of the plurality of channel filters are configured using high-Q transmission lines, wherein the components of each of the plurality of channel filters comprise a series inductor, a series capacitor, and a shunt capacitor, wherein the series inductor is configured using a high impedance transmission line, the series capacitor is configured using an edge coupled transmission line, and the shunt capacitor is configured using a wide transmission line, wherein the RF input, the inductive manifold, and the plurality of channel filters are disposed on a fused silica quartz substrate.

19. The system of claim 18, wherein the high-Q transmission lines comprise one of micro-strip transmission lines, co-planar waveguide transmission lines, and substrate integrated waveguide transmission lines.

20. The system of claim 18, wherein at least one of the plurality of channel filters comprises a tunable notch filter therein.

* * * * *